United States Patent [19]

Yoder

[11] Patent Number: 4,947,220
[45] Date of Patent: Aug. 7, 1990

[54] YOKED, ORTHOGONALLY DISTRIBUTED EQUAL REACTANCE AMPLIFIER

[76] Inventor: Max N. Yoder, 6512 Truman La., Falls Church, Va. 22043

[21] Appl. No.: 89,892

[22] Filed: Aug. 27, 1987

[51] Int. Cl.$^5$ .................. H01L 29/48; H01L 29/161; H03F 3/16
[52] U.S. Cl. ........................................ 357/22; 357/15; 357/16; 330/277
[58] Field of Search ..................... 357/22 F, 22 H, 15, 357/16; 330/277, 286, 307

[56] References Cited

U.S. PATENT DOCUMENTS

| | | | |
|---|---|---|---|
| 3,427,514 | 2/1969 | Olmstead et al. | 357/23.14 |
| 3,564,442 | 2/1971 | Germann | 330/54 |
| 4,048,646 | 9/1977 | Ogawa et al. | 357/22 H |
| 4,291,286 | 9/1981 | Wagner | 330/277 |
| 4,628,338 | 12/1986 | Nakayama et al. | 357/22 I |
| 4,686,387 | 8/1987 | Rumelhard | 330/277 |
| 4,737,733 | 4/1988 | Laprade | 330/277 |
| 4,760,350 | 7/1988 | Ayasli | 330/277 |

OTHER PUBLICATIONS

G. McIver et al., "A Traveling-Wave Transistor," Proc. IEEE, Nov. 1965, pp. 1747, 1748.

M. N. Yoder, "Applications of Diamond Technology" (copies in viewgraphs shown in Jul. 1986).
"Solicitation No. N00014-86-R-0047" (Source Selection Procedure: Traveling Wave Techniques for Broadband Power Amplifiers) (mailed on or about Sep. 1, 1986).

Primary Examiner—Rolf Hille
Assistant Examiner—Wael Fahmy

[57] ABSTRACT

A field effect transistor device especially useful in common gate amplifier circuits for use with millimeter wave and microwave signals. By forming the device in a unitary monolith, and by making the device's source to gate and drain to gate geometry identical, the input and output portions of the device are symmetric and impedance matched, increasing the device's power handling capacity. The device's source and drain contain heavily doped regions which operate to increase the device's upper frequency range, and also act as inherent channel end stops. In several embodiments, plural such devices are yoked together integrally source to drain, eliminating common structures of adjacent stages, simplifying the device and its fabrication, and permitting traveling wave amplification.

12 Claims, 3 Drawing Sheets 4,947,220

YOKED, ORTHOGONALLY DISTRIBUTED EQUAL REACTANCE AMPLIFIER

Reference is made to copending applications "Yoked, Orthogonally Distributed Equal Reactance Non-Coplanar Traveling Wave Amplifier" of Yoder and Morgan, Ser. No. 095,487 filed Aug. 27, 1987, and to copending application "High Power Diamond Traveling Wave Amplifier" of Yoder, Ser. No. 101,919, filed Sept. 24, 1987.

BACKGROUND OF THE INVENTION

The invention pertains to unipolar semiconductor devices especially useful as amplifiers of micro and millimeter wave signals.

Field Effect Transistors are commonly used as amplifiers of high frequency electromagnetic signals, and heretofore have been most commonly used in common source amplifier circuits. Unfortunately, common source amplifiers have the inherent limitation that the drain to ground (output) impedance cannot be made equal to the gate to ground (input) impedance, a severe limitation on power transmission along a gate stripe. An alternate statement of this problem is that in no common source amplifier circuit can the phase velocity of the input signal equal that of the output signal, making phase cancellation between input and output stages unavoidable. Heretofore this problem has been overcome by making such amplifier circuits very small in the direction of wave propagation, thus severely limiting the power handling capacity of such amplifiers. Because common gate amplifier circuits can, theoretically, have impedance matched inputs and outputs, an FET device specially adapted to internally match its input and output impedance could form the basis of an especially effective high frequency amplifier.

Another problem facing designers of high frequency amplifiers is material limitations that restrict high frequency range. To achieve high gain, one often must use plural amplifier stages; however, increasing the number of stages also increases the transit time of charge carriers across the device, limiting the device's response time, i.e., upper frequency range. Moreover, a peculiar property of some semiconductors (e.g., compound semiconductors of III–V material) i.e. whose elements are taken from columns III and V of the Periodic Table is that drift velocity of charge carriers increases with increasing field strength only up to a point, and thereafter decreases with increasing field strength This means that after a certain point, increasing field strength actually decreases device response time, and the device's upper frequency range.

Finally, because these amplifiers, like any semiconductor amplifiers, are regularly fabricated unitarily in monolithic chips, the more the number of fabrication steps, and the delicacy and complexity of each step, the more the likelihood of some fatal error that would render a chip fatally defective.

SUMMARY OF THE INVENTION

Accordingly, an object of the invention is to increase the power output of FET amplifiers of micro and millimeter wave frequencies by providing a device that, in a common gate amplifier circuit, has identical input and output impedance.

Another object is to increase the power output of the device by increasing its size in the direction of wave propagation without causing phase cancellation between device input and output.

Another object is to extend the device's upper frequency range by restricting the electric field intensity throughout the device's channel to the vicinity corresponding to maximum carrier drift velocity.

Another object is to increase the frequency response, and simplicity and reliability of fabrication, of the device by yoking together a plurality of such devices in a single monolith, so as to eliminate common parts and reduce net transit time across the yoked devices.

In accordance with these and other objects made apparent hereinafter, there is disclosed an FET device especially useful in common gate high frequency amplifier circuits. The FET device is formed monolithically and symmetrically so that both the materials of fabrication and geometry of the device make the source to gate (input) portion of the device a mirror image of the drain to gate (output) portion. Because of this symmetry, and the high uniformity of material between the input and the output possible because of monolithic fabrication, the input and output portions of the FET device are impedance matched (i.e., waves traversing these portions have virtually identical phase velocities). The source and drain of this device have regions highly doped a preselected amount with respect to the remainder of the device channel effective to ensure that a charge carrier traversing the device's channel never experiences an electric field significantly above that which corresponds to maximum carrier drift velocity, thus increasing the device's upper frequency range. In one embodiment, a plurality of these devices are yoked together, source to drain, in a unitary multistage device. Adjacent sources and drains of adjacent stages are made unitary, thus eliminating common parts and simplifying device fabrication. Moreover, by making these stages unitary in one monolith, and eliminating device parts, the yoked device minimizes distance in the direction of charge carrier motion, increasing the yoked device's response 7 time, and hence upper frequency range.

The invention is more fully understood from the following detailed description of preferred embodiments, it being understood, however, that the invention is capable of extended application beyond the precise details of the preferred embodiments. Changes and modifications can be made that do not affect the spirit of the invention, nor exceed its scope, as expressed in the appended claims. Accordingly, the invention is now described with particular reference to the accompanying drawings, wherein:

DETAILED DESCRIPTION OF PREFERRED EMBODIMENTS

Figure 1:
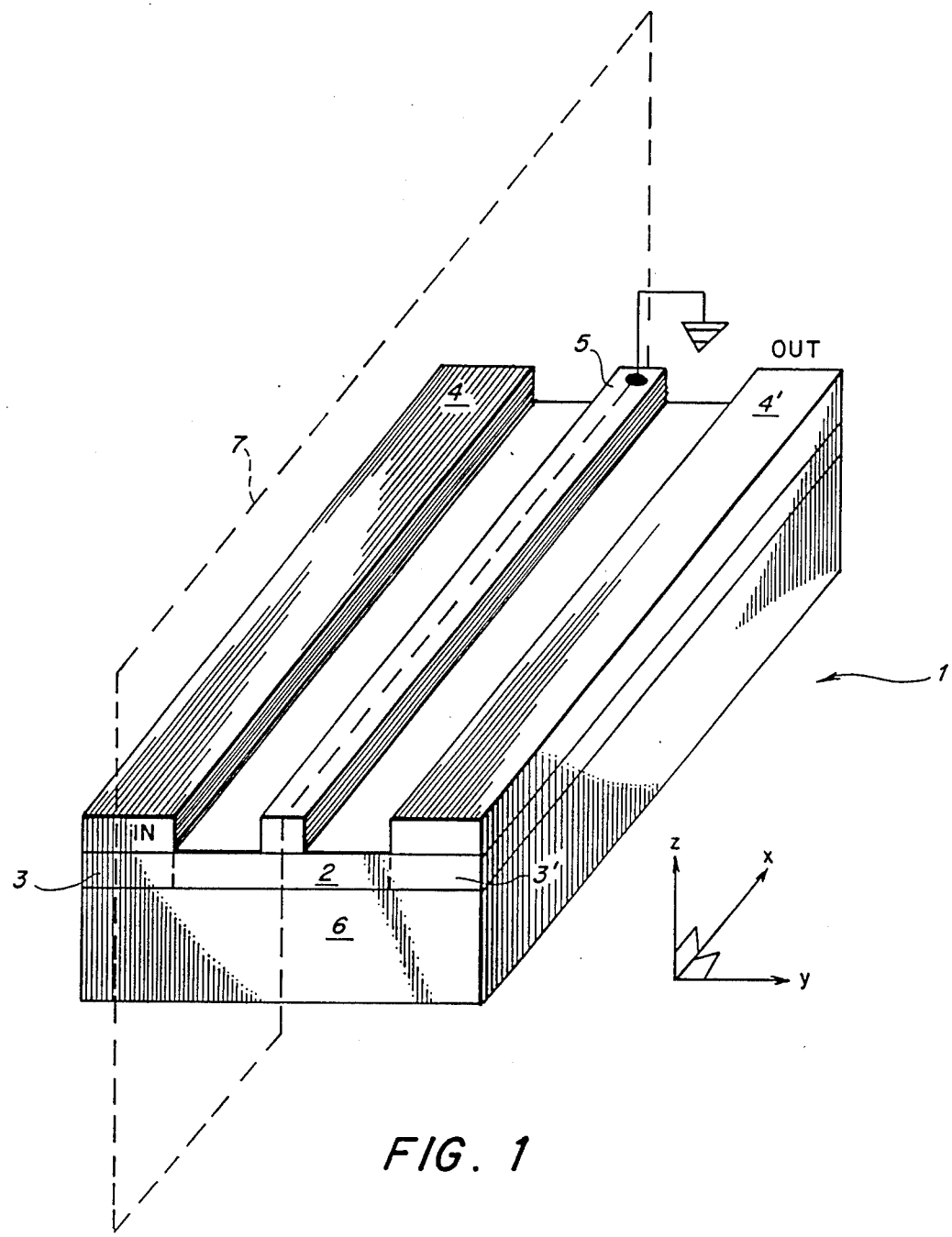
FIG. 1 is an elevational isometric view of a device according to the invention.

With special reference to FIG. 1, an FET device 1 according to the invention is shown. Device 1 is a monolith having semi-insulating gallium arsenide substrate 6 and a unitary n-doped layer 2, 3, 3' of gallium arsenide. Unitary layer 2, 3, 3' has end portions 3, 3' heavily doped with respect to the remainder 2 of the layer which forms the channel. Overlaying heavily doped regions 3, 3' are metal microstrips 4, 4'. Intermediate of microstrips 4, 4' along channel 2 is metal microstrip 5, which forms the gate of device 1. Gate 5 is illustrated as connected to rf ground, emphasizing the special utility of this device in common gate amplifier circuits. Adjacent to device 1 are orthogonal directions x, y, z, which show the symmetry of device 1. As can be seen from FIG. 1, unitary layer 2, 3, 3' lies in a plane parallel to that of directions x, y, and metal microstrips 4, 4', 5 extend parallel to direction x and orthogonal to directions y and z. Plane 7, disposed parallel to the plane formed by directions x, z and orthogonal to direction y, divides device 1 into input and output portions which are mirror images to one another. (It is to be remembered that, strictly speaking, the input and output portions are the waveguides (transmission lines) formed by source 3, 4 and gate 5 on the one hand, and drain 3', 4' and gate 5 on the other, both waveguides having mirror image symmetry about plane 7.)

In operation, a signal enters device 1 at the portion of microstrip 4 marked "IN" and travels down microstrip 4 and region 3, i.e., in the x direction. The direction of the electric field is orthogonal to wave propagation, creating an electric potential orthogonal to the direction of wave propagation, i.e., along the x and y directions. Charge carriers traversing channel 2 and entering drain 3', 4' set up a corresponding but amplified electric field in output side of device 1 which propagates along the x direction in drain 3', 4' as did the input wave in source 3, 4. Because of the geometrical symmetry between input and output, and because of the uniformity of material between corresponding portions of the input and output made possible by monolithic fabrication and the identical dielectric constant of the input and output portions, the phase velocity of signals in the input and output portions, are virtually identical, precluding phase cancellation between input and output. Knowing beforehand the intended dynamic range of device 1, one can preselect the doping for optimum response. An additional benefit of the high doping in regions 3, 3' is that dipole domains forming within channel 2 can be quenched. Because of the negative relationship between high electric field strength and drift velocity of gallium arsenide, bunching of electrons can occur in FET channels such as channel 2 of FIG. 1. Such bunched charge carriers create regions of high local charge adjacent regions of relatively lesser charge, thus forming a dipole. The preselected doping of regions 3 and 3' in device 1 hinders bunching because field strength is precluded from ever greatly exceeding that corresponding to maximum carrier velocity. Moreover, even if large localized fields should occur, the lowered field potential in regions 3, 3' collect resulting dipole domains, quenching them and preventing them from degrading device response.

Figure 2:
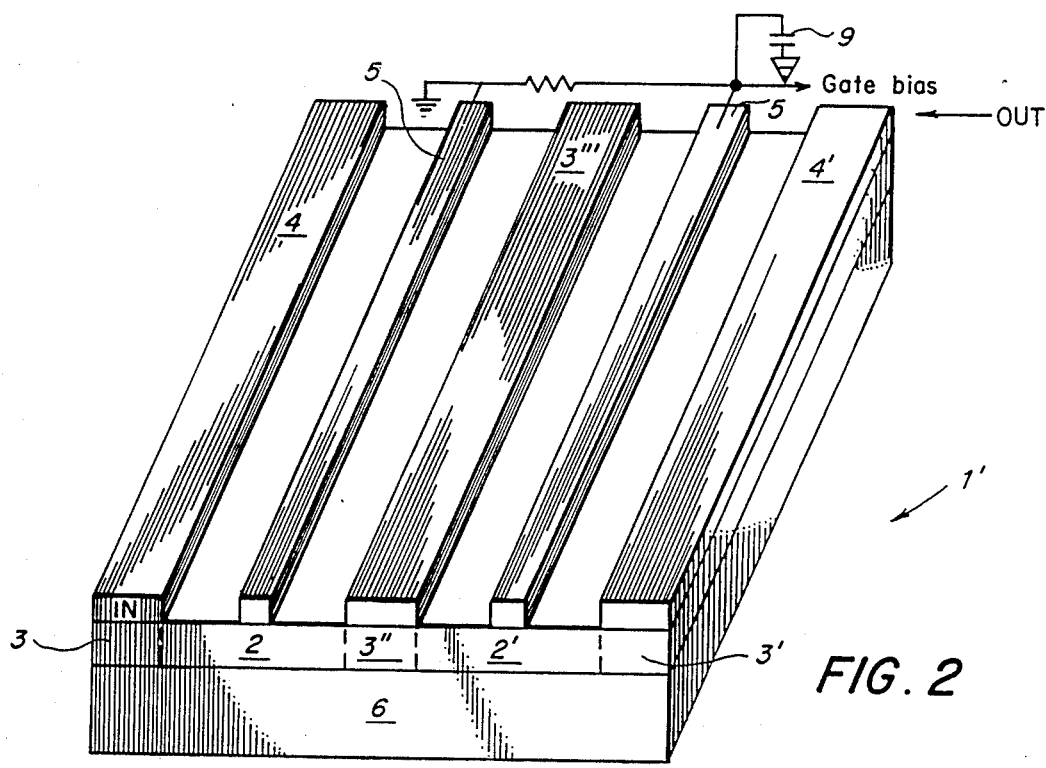
FIG. 2 is a similar view of two such devices yoked into a unitary device.

With particular reference to FIG. 2, a device 1' is shown constituted from two devices of the kind shown in FIG. 1 yoked together into a single two-stage FET amplifier. (Common reference numerals between FIGS. 1 and 2 indicate similar parts.) Of special import to device 1' is that metal microstrip 3''' overlying heavily doped region 3'' is a common element of each stage, i.e., it is the drain of the stage having source 3, 4 and is the source of the stage having drain 3', 4'. By integrating a plurality of stages in this fashion one microstrip and one heavily doped region is eliminated, saving not only the materials necessary for these stages but more importantly the fabrication steps necessary for these parts, thus simplifying and making more reliable the process by which these devices are manufactured. Gate 5' is separated from rf ground by resistor 8, which sets the correct bias for gate 5' and the second FET stage of device 1'. The gate 5' must be held at RF ground by a capacitor 9.

Figure 3:
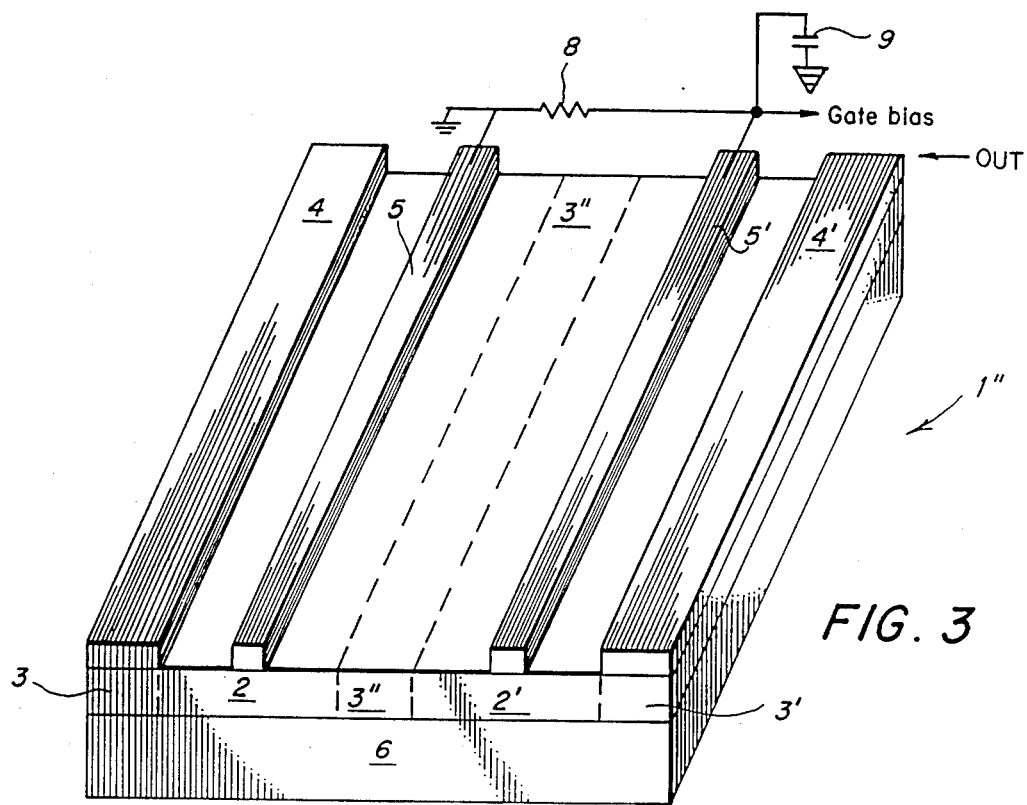
FIG. 3 is a similar view to that of FIG. 2 showing a variation of the embodiment of FIG. 2.

With special reference to FIG. 3, a variation of the device of FIG. 2 is shown, again similar reference numerals indicating similar device parts. Here device 1'' differs from device 1' of FIG. 2 by the elimination of a metallic microstrip (3''' in FIG. 2) from the source-drain common to the two stages of device 1''. This can be done for several reasons: Because the region 3'' is an intermediate one, there is no need for an output lead connected electrically to this region, unlike input 4 and output 4'. Because of the heavy doping in region 3'' of unitary layer 2, 2'', 3, 3', 3'', region 3'' has far less specific resistivity than does regions 2, 2' of the gallium arsenide channel. Thus, the velocity of a signal traversing 3'' will be virtually identical to that traversing low resistivity metal microstrips 4, 4' and region 3'' can act above as an end stop of channels 2, 2'. Eliminating the metal microstrip that overlays region 3'' of device 1' of FIG. 2, eliminates one more device part, and incrementally simplifies and makes more reliable the fabrication of device 1''. Elimination of metal strip 3''' also eliminates the possibility of unwanted backward traveling waves.

Although the embodiments of FIGS. 2 and 3 have two stages, this does not preclude devices having more stages yoked in a like manner.

Figure 4:
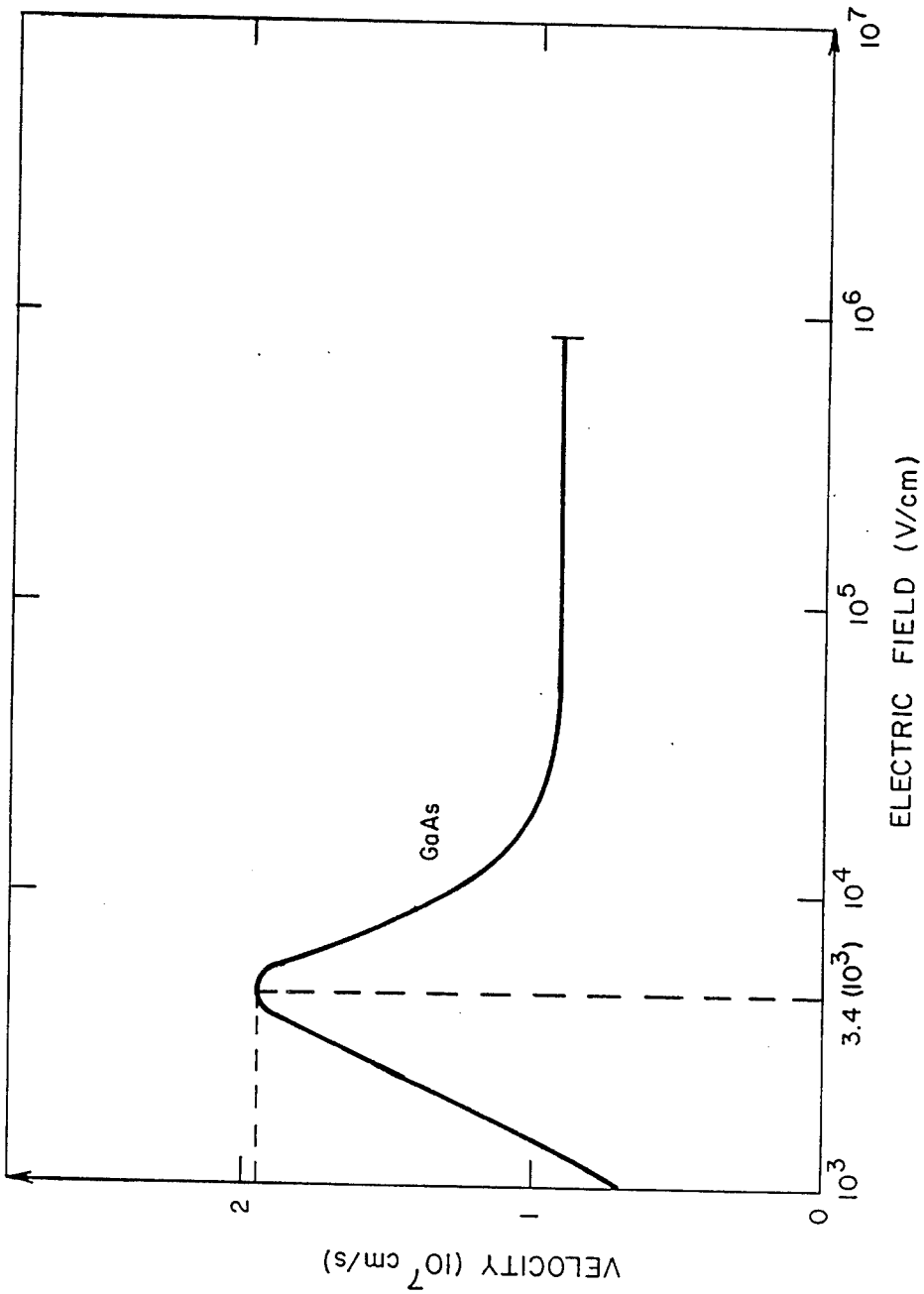
FIG. 4 is a graph showing the relationship in the semiconductor gallium arsenide of electric field potential and equilibrium drift velocity.

With reference to FIG. 4, FIG. 4 shows the relationship referred to above between electric field intensity and steady state drift velocity of carriers in gallium arsenide. Drift velocity increases with increasing field strength until about 3.4k volts per cm., after which velocity drops sharply with increasing field strength to a plateau region far below the curve maximum. The heavy (e.g., $>5\times10^{18}/cm^3$) impurity doping in regions 3'' reduces the electric field in that region to a value below 3.5 kV/cm thereby insuring that electrons entering the subsequent gain stage are in their lowest effective mass state. It is noted that electrons in gallium arsenide subjected to electric fields of less than 3.5 kV/cm are wholly in their lowest mass state while GaAs in fields above this value has an increasingly large percentage of electrons in their heavy mass state, thus reflecting the reduced velocity shown in high field regions of FIG. 4.

The invention has been shown in what is considered to be the most practical and preferred embodiments. It is recognized, however, that obvious modifications may occur to those with skill in this art. Accordingly, the scope of the invention is to be discerned solely by reference to the appended claims.

What is claimed and desired to be secured by Letters Patent of the United States is:

1. A Field Effect Transistor device comprising:
   one or more field effect transistor stages formed in a semiconductor monolith;
   each stage of said stages comprising a source, a drain, and a gate;
   said source and said gate of said each stage constituting the input portion of said each stage;

said drain and said gate of said each stage constituting the output portion of said each stage;

the geometry of said device, and the forming of said device in said semiconductor monolith, being effective to cause said input portion and said output portion of said each stage to be mirror images of one another;

whereby said geometry and said forming of said device in said monolith is effective to cause the phase velocity of wave propagation in said input and said output stages of said each stage to be substantially identical, whereby to eliminate phase cancellation between said input portion and said output portion of said each stage.

2. The device of claim 1, wherein each said each stage of said one or more stages comprises:

a unitary layer of doped semiconductor material, said unitary layer having a first region and a second region, said first and said second regions being more heavily doped than the remainder of said layer by a preselected amount;

said first region of said each stage being effective as said source of said each stage;

said second region being effective as said drain of said each stage;

said remainder being effective as said channel of said each stage.

3. The device of claim 1, wherein said one or more stages is a plurality of stages sequentially yoked together, each said source and each said drain of adjacent stages of said plurality of stages being unitary and common to both of said adjacent stages, and wherein:

said monolith comprises a unitary layer of doped semiconductor material, said unitary layer comprising said source, said drain, and said channel of said each stage;

said channel of said each stage having a first region and a second region, said first and said second regions being more heavily doped than the remainder of said layer by a preselected amount;

said first region of said each stage being effective as said source;

said second region of said each stage being effective as said drain;

said remainder of said each stage being effective as said channel;

said first and second regions being effective to limit the magnitude of the potential difference within said first and said second regions respectively therein form exceeding a magnitude of about that corresponding to the maximum carrier equilibrium drift velocity in said semiconductor material;

said semiconductor is n-doped gallium arsenide;

said monolith is formed generally linearly symmetric about three orthogonal dimensions, a first dimension of said three dimensions being disposed in the direction of charge flow across said channel of said each stage, a second dimension of said three dimensions being disposed in the direction of wave propagation in said device;

said layer being disposed generally in the plain formed by said first dimension and said second dimension;

said first and said second region of said each stage being generally linear and extending along said second dimension;

said gate of said each stage comprising a metal microstrip extending linearly along said second dimension;

said source and said drain of said each stage comprising a metal microstrip overlaying said heavily doped region of said source and said drain;

said monolith comprising a substrate of semi-insulating gallium arsenide disposed abuttingly adjacent said layer opposite said gate.

4. A travelling wave amplifier comprising:

one or more field effect transistor stages formed in a semiconductor monolith;

each stage of said one or more stages comprising a source, a drain, and a gate, said each stage being in a common gate configuration, said source and said gate of said each stage constituting the input waveguide of said each stage, said drain and said gate constituting the output waveguide of said each stage;

and wherein said input waveguide and said output waveguide of said each stage are adapted to be impedance matched.

5. The amplifier of claim 4, wherein said input waveguide and said output waveguide are adapted to be impedance matched by said input and output waveguides being formed as mirror images of one another.

6. The amplifier of claim 5, wherein said one or more stages is a plurality of stages sequentially yoked together, each source and each drain of adjacent stages of said plurality of stages being unitary and common to both of said adjacent stages.

7. The amplifier of claim 6, wherein, for at least two adjacent stages, the unitary source and drain shared by said at least two adjacent stages is a portion of said semiconductor monolith, said portion of said semiconductor monolith having high doping with respect to the channels of both of said two adjacent stages, said high doping being of a sufficient magnitude to permit said portion of said semiconductor monolith to constitute a microstripline without external biasing or metalization of said portion.

8. The amplifier of claim 7, wherein said amplifier comprises means for limiting charge carrier velocity between said source and said drain of said each stage to at or below the maximum carrier drift velocity of the material constituting said channel.

9. The amplifier of claim 4, wherein said one or more stages is a plurality of stages sequentially yoked together, each source and each drain of adjacent stages of said plurality of stages being unitary and common to both of said adjacent stages.

10. The amplifier of claim 4, wherein, for at least two adjacent stages, the unitary source and drain shared by said at least two adjacent stages is a portion of said semiconductor monolith, said portion of said semiconductor monolith having high doping with respect to the channels of both of said two adjacent stages, said high doping being of a sufficient magnitude to permit said portion of said semiconductor monolith to constitute a microstripline without external biasing or metalization of said portion.

11. The amplifier of claim 4, wherein said amplifier comprises means for limiting charge carrier velocity between said source and said drain of said each stage to or below the maximum carrier drift velocity of the material constituting said channel.

12. The amplifier of claim 4, wherein said input waveguide and said output waveguide of said each stage are adapted to be impedance matched for traveling waves of wavelength smaller than about one millimeter.

* * * * *